United States Patent [19]

Schonstedt

[11] 3,961,245
[45] June 1, 1976

[54] MAGNETIC LOCATOR HAVING IMPROVED SENSORS

[75] Inventor: Erick O. Schonstedt, Reston, Va.

[73] Assignee: Schonstedt Instrument Company, Reston, Va.

[22] Filed: Nov. 20, 1974

[21] Appl. No.: 525,574

[52] U.S. Cl. ............................ 324/43 R; 324/43 G
[51] Int. Cl.² ......................................... G01R 33/02
[58] Field of Search ............... 324/43 R, 43 G, 41, 324/3, 47

[56] References Cited
UNITED STATES PATENTS
3,050,679  8/1962  Schonstedt .................. 324/43 R OTHER PUBLICATIONS
Sky and Telescope; Mar. 1970; p. 193.

Primary Examiner—R. V. Rolinec
Assistant Examiner—Ernest F. Karlsen
Attorney, Agent, or Firm—Shapiro and Shapiro

[57] ABSTRACT

An improved flux gate sensor for a magnetic locator or the like employs a housing which enables pivotal adjustment of a tubular magnetic core contained therein in order to adjust the angular orientation of the magnetic axis of the sensor. The housing comprises an elongated bobbin having a longitudinal cavity therein for receiving the core, and an end piece connected to the bobbin. One end of the core is pivotally engaged by the bobbin, the other end of the core being engaged by the end piece which is movable transversely relative to the bobbin to adjust the angular orientation of the core in the housing. The bobbin, which may be formed in one piece or in two identical half sections, has an outer circumferential groove thereon for receiving a signal winding.

20 Claims, 7 Drawing Figures

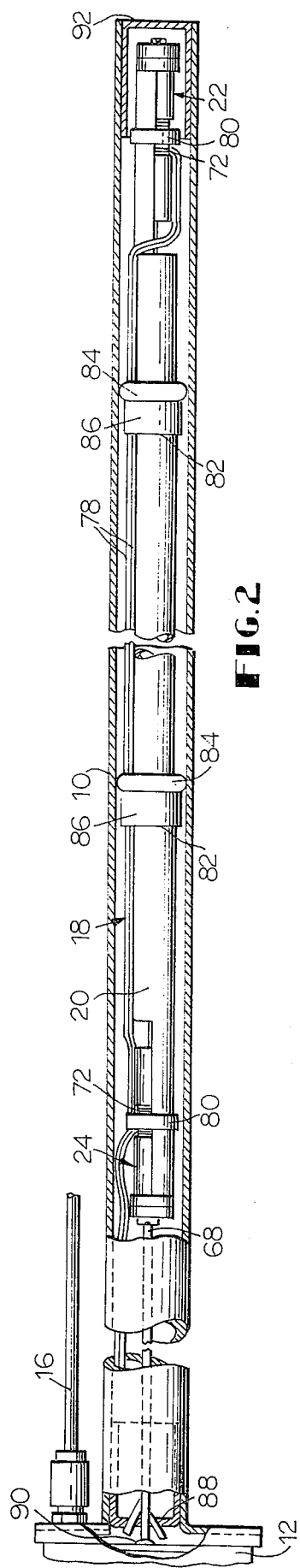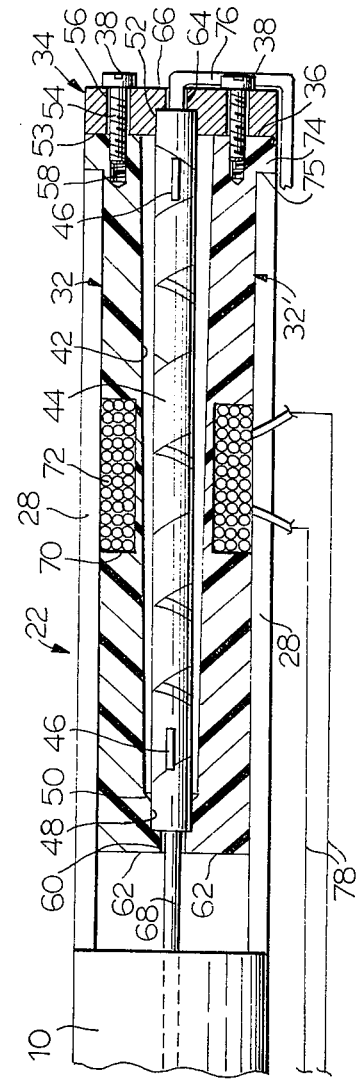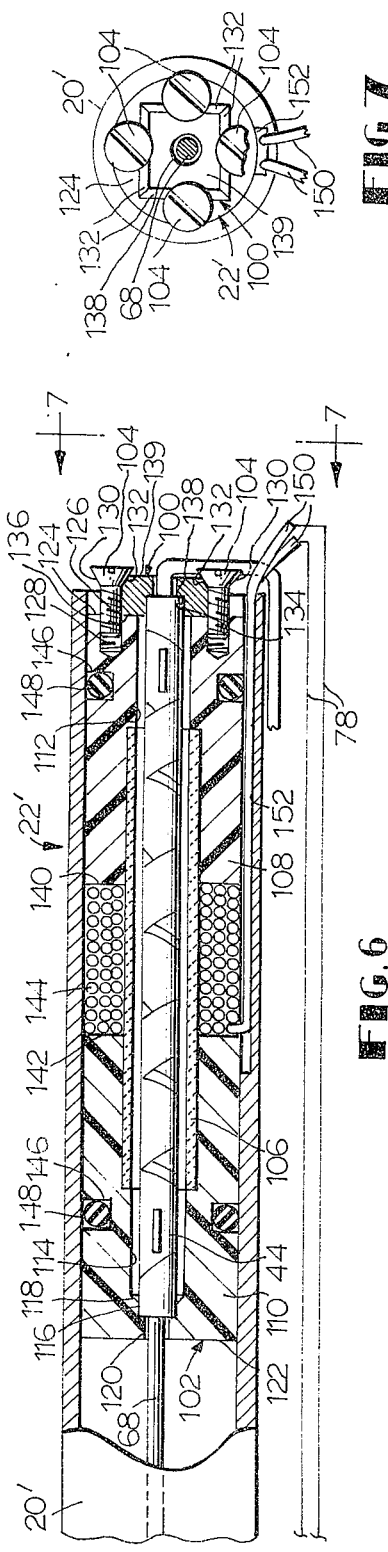

MAGNETIC LOCATOR HAVING IMPROVED SENSORS

BACKGROUND OF THE INVENTION

This invention relates to apparatus, such as a magnetic locator, for measuring or detecting magnetic phenomena, such as magnetic fields, objects, or disturbances, and is more particularly concerned with improved magnetic sensors which may be employed in such apparatus.

Saturable core (fluxgate) magnetic locators or gradiometers comprise at least two electrically matched field-sensing elements mounted on a non-magnetic structure such that their magnetic axes are, theoretically, precisely parallel or coaxial. The output signals of the two sensors are arranged such that they oppose each other. If the structure is oriented in any direction in a uniform magnetic field, the components of magnetic field existing at each sensor are equal, so that there is no resulting output signal from the combination of the two sensors.

If a magnetic object exists within the detection range of the instrument, the magnetic field will generally be stronger at one of the sensors than at the other sensor. As a result, the output signal of one sensor will be greater than that of the other, so a net difference signal will be produced that is indicative of the presence of the object.

For accuracy of operation, the magnetic axes of the two sensors must be precisely aligned. The precision required is of the order of three seconds of arc if the error signal due to misalignment of the magnetic axes is to be less than 1 gamma ($10^{-5}$ gauss) in an ambient magnetic field of 60,000 gammas. If the magnetic axes of the two sensors are not precisely aligned, the component of the ambient magnetic field existing along the magnetic axis of one sensor will not be the same as the component of the magnetic field existing along the magnetic axis of the other sensor. The difference between the two sensor signals will not be zero, and a false signal will be obtained due to the mechanical misalignment.

In certain prior art fluxgate gradiometers alignment has been achieved by mechanical adjustment or bending of structural members, such as a tube in which the sensors are mounted. See, for example, the applicant's prior U.S. Pat. No. 3,050,679, issued Aug. 21, 1962. The bending of the tube places the tube under stress. In time, the stress may be relieved and the sensors may become misaligned, resulting in inaccuracy and the need for readjustment.

The applicant's prior U.S. Pat. No. 3,488,579, granted Jan. 6, 1970, discloses a system by which compensation for misalignment is produced electrically. While this system is capable of compensating for misalignment with high precision, its cost may be higher than is justified when such high accuracy is not required.

It has heretofore been proposed to provide bodies of easily magnetizable material adjacent to gradiometers for compensating for extraneous magnetic effects and misaligned cores. See, for example, U.S. Pat. No. 2,966,853, granted Jan. 3, 1961 to Gilfillan et al; U.S. Pat. No. 3,012,191, granted Dec. 5, 1961 to Miller et al; and U.S. Pat. No. 2,976,483, granted Mar. 21, 1961 to Moore et al. However, such schemes for compensating for extraneous effects and misaligned cores have been capable of minimal adjustment and limited flexibility, and have required the attachment of additional elements to the sensor cores themselves with commensurate complexity and susceptability to errors resulting from core stresses. The applicant's prior U.S. Pat. Nos. 3,487,459, granted Dec. 30, 1969 and 3,757,209, granted Sept. 4, 1973, disclose improved mechanically adjustable compensators which avoid such problems.

In certain other prior art gradiometers, the magnetic axes of a pair of sensors are aligned by mechanically, pivotally adjusting one or both sensors relative to a support member common to both sensors. See, for example, U.S. Pat. No. 2,620,381 to Mayes et al; U.S. Pat. No. 2,642,479 to Jones; U.S. Pat. No. 3,064,185 and No. 3,065,413 to Ferguson. The structures employed in these gradiometers to effect pivotal adjustment of the sensors, which have considerable mass, are complex and costly.

SUMMARY OF THE INVENTION

The principal object of the invention is to provide modified and improved magnetic sensors constructed to enable simple, precise mechanical adjustment of the angular orientation of the magnetic axes thereof in order to correct for misalignment in a magnetic locator, gradiometer or the like employing such sensors.

Another object of the invention is to provide improved sensors of the above-described type which avoid significant stressing of the magnetic core or of the support structures for the sensors.

Still another object of the invention is to provide improved sensors of the above-described type wherein the angular orientation of the magnetic axes of the sensors is adjusted without requiring angular adjustment of the positions of the sensors relative to support members.

Briefly stated, in a magnetic sensor in accordance with the invention, a tubular magnetic core is contained in a housing which includes an elongated bobbin having a longitudinal cavity therein for receiving the core and an end piece connected to the bobbin, one end of the core being pivotally engaged by the bobbin and the other end of the core being engaged by the end piece. The position of the end piece is adjustable transversely relative to the bobbin to pivot the core about the end thereof which is engaged by the bobbin. The end piece may be connected to the bobbin by headed screws having threaded shank portions extending through holes in the end piece and into threaded bores provided by the bobbin, the diameter of the holes in the end piece being substantially greater than the diameter of the shank portions of the screws so as to enable transverse adjustment of the end piece relative to the bobbin before the screws are tightened. Alternatively, flat-head screws may be threaded into the bobbin at points spaced around and closely adjacent to the perimeter of the end piece so that the conical surfaces of the screw heads are in contact with the marginal portions of the end piece, transverse adjustment of the end piece being effected by loosening one screw and tightening the screw opposite it.

In the preferred embodiments, the bobbin and the end piece provide longitudinal, cylindrical bores dimensioned to snugly receive the ends of the core, the bobbin and the end piece being formed of material, such as plastic, which is sufficiently deformable to permit limited pivotal movement of the core with respect thereto without subjecting the core to appreciable bending stresses. The bobbin may be formed in one piece or in a pair of identical half sections and the cavity in the bobbin may be tapered to accommodate pivotal movement of the core. The bobbin has a central circumferential groove thereon for receiving a signal winding. To provide increased sensitivity, the portion of the bobbin having the circumferential groove may comprise a thin-walled ceramic tube.

BRIEF DESCRIPTION OF THE DRAWINGS

The invention will be further described in conjunction with the accompanying drawings, which illustrate preferred and exemplary embodiments, and wherein:

FIG. 2 is a longitudinal view, partly in section, showing the internal arrangement of the locator, and particularly showing the manner in which the magnetic sensors are mounted.

FIG. 5 is a fragmentary bottom view of one end of the tubular support and a magnetic sensor, with the sensor in cross-section to illustrate the manner in which the sensor is assembled with the excitation conductor and signal pick-up winding;

FIg. 6 is a fragmentary view of one end of another tubular support having a second embodiment of a sensor in accordance with the invention, with the tubular support broken away and with the sensor in cross-section; and FIG. 7 is an end view of the tubular support and the sensor of FIg. 6, with one of the screws broken away and with the excitation conductor in cross section for clarity of illustration.

DETAILED DESCRIPTION OF THE INVENTION

Figure 1:
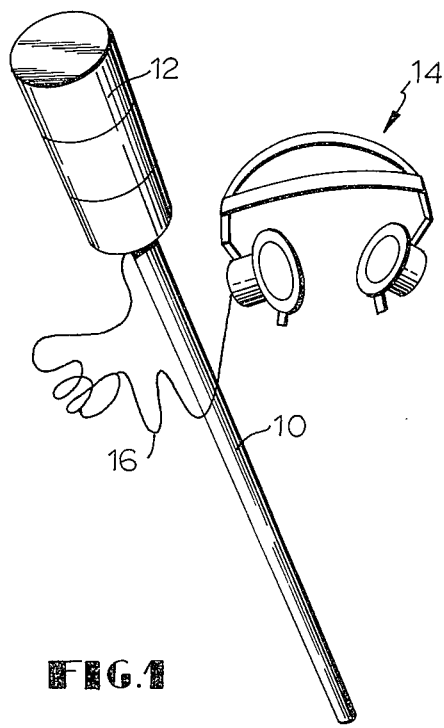
FIG. 1 is a perspective view showing the external configuration of a magnetic locator employing a pair of magnetic sensors made in accordance with the invention.

Referring to the drawings, FIG. 1 illustrates the external configuration of a magnetic locator of the type disclosed in applicant's copending applications Ser. No. 303,598, filed Nov. 3, 1972, and No. 465,357, filed Apr. 29, 1974 (both incorporated herein by reference in entirety), and which may advantageously employ the improved magnetic sensors of the present invention. As will be seen hereinafter, the sensors of the invention have constructions which enable simple mechanical adjustment of the angular orientation of the magnetic axes of the sensor cores with respect to the sensor housings. Specifically, the sensors of the invention employ a housing which enables pivotal adjustment of the magnetic core relative to the housing, which has the signal pick-up winding thereon, this construction having the advantage that the mass of the element to be aligned is minimal. In magnetic detecting apparatus, such as a gradiometer or the illustrated magnetic locator, a first sensor made in accordance with the invention may be employed either with another such sensor or with a sensor having a fixed magnetic axis, such as the sensors disclosed in the aforementioned copending applications, so that the magnetic axis of the first sensor can be adjusted with precision to provide the desired degree of alignment with the magnetic axis of the other sensor, as is necessary for accuracy of operation.

As shown in FIG. 1, the locator resembles a broomstick with a can at one end thereof, the "broomstick" being a one-piece elongated tubular housing 10 having a smooth exterior, and the "can" being a tubular housing 12 of larger diameter fixed to one end of housing 10. Earphones 14 are connected by cable 16 to a circuit within the housing 12. Since the locator is lightweight, the user may readily support the apparatus by grasping the top of housing 10 just below housing 12, and may sweep the free lower end of housing 10 along the ground in a search for a hidden magnetic object. Object detection will be signaled in the earphones 14, as will appear more fully hereinafter.

Figure 3:
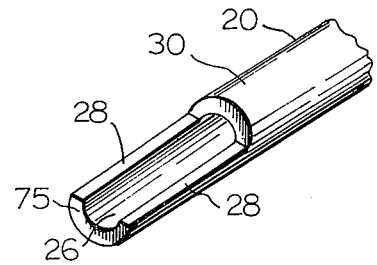
FIG. 3 is a fragmentary perspective view showing one end of a tubular support for the sensors.

Referring to FIG. 2, the interior of housing 10 contains an assembly 18 comprising a tubular support 20, magnetic sensors 22 and 24 constructed in accordance with a first embodiment of the invention, and other parts which will be described hereinafter. The tubular support 20 is an elongated, non-magnetic type, preferably of circular cross-section, and may be an aluminum tube about 22 inches long with an outer diameter of ⅝ inch and an inside diameter of 0.5 inch. To provide receptacles for the mounting of the sensors, each end of the tube is cut away at a side thereof to form a longitudinal groove or notch, such as the groove 26 in FIG. 3, the groove being approximately semi-circular in cross-section. The groove may be about 2½ inches long, for example, and the longitudinal edges 28 may be positioned about 1/4 inch below side 30 of the tube. The grooves at opposite ends of the tubular support 20 preferably face opposite sides of the support. This tends to produce equal and opposite stresses in the support material and thus tends to maintain parallelism, more particularly co-linearity, of the magnetic axes of the sensors, which is necessary for accurate results.

Figure 4:
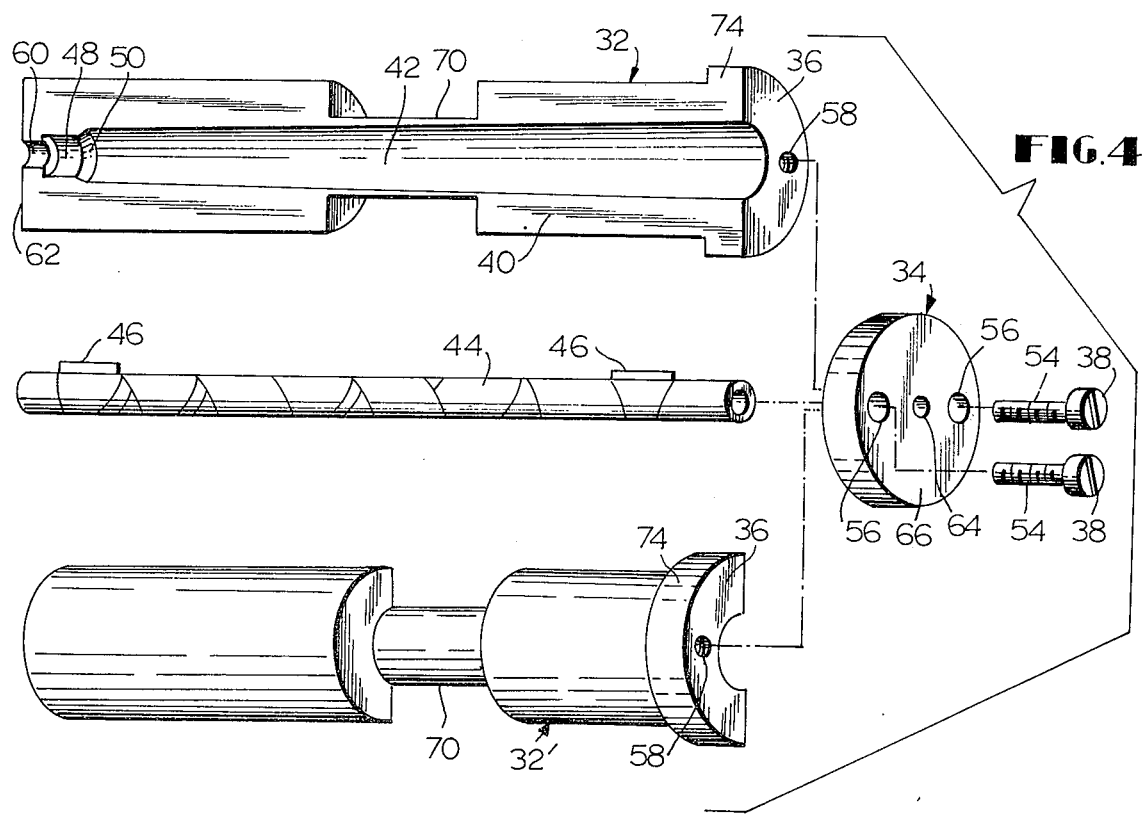
FIG. 4 is an exploded perspective view of a first embodiment of a magnetic sensor constructed in accordance with the invention.

Referring to FIGS. 4 and 5, the magnetic sensor, such as sensor 22 of FIG. 2, made in accordance with the first embodiment of the invention includes an insulating housing which comprises an elongated cylindrical bobbin formed by a pair of identical semi-cylindrical molded bobbin sections 32 and 32' (alternatively, the bobbin may be molded in one piece), and further comprises a thin, cylindrical end piece 34 for connection to planar end surfaces 36 of the bobbin sections by non-magnetic, brass screws 38. The longitudinal planar surface 40 of each bobbin section has a longitudinal recess 42 therein, preferably semi-circular in cross-section. When the bobbin sections are assembled by being fitted together so that the planar surfaces 40 mate, recesses 42 form an elongated cavity for containing a single tubular magnetic core 44, the cavity being aligned with the longitudinal axis of the bobbin and having one end thereof opening to the outside of the bobbin through end surfaces 36 of the bobbin sections. The core is preferably formed by winding strips of magnetic material, such as Permalloy strips, about a ceramic tube and joining the ends of the strips at the laps 46 thereof, as taught by applicant's prior U.S. Pat. No. 2,981,885, for example. The bobbin sections are provided with relatively short, longitudinal recesses 48 which are axially adjacent to and smaller in cross-section than recesses 42, recesses 48 being semi-circular in cross-section and dimensioned to form a cylindrical bore for snugly receiving one end of the tubular core when the bobbin sections are assembled. The bobbin sections are further provided with recess portions 50 which are located intermediate recesses 42 and 48 and which co-operate when the bobbin sections are assembled to provide a frusto-conical shoulder for facilitating insertion of the end of the core into the cylindrical bore formed by recesses 48.

A longitudinal cylindrical bore 52 (FIG. 5) extends axially from planar end surface 53 of the end piece 34 through approximately one-half the thickness of the end piece, this bore being dimensioned to snugly receive the other end of the core. After the bobbin sections and end piece have been assembled with the core so that the opposite ends of the core are received by the corresponding bores in the bobbin and the end piece (the bobbin sections being clamped together by means of a signal winding, described later), the end piece is connected to end surfaces 36 of the bobbin sections by a pair of headed screws 38. The threaded shank portions 54 of the screws extend through respective, diametrically opposite holes 56 in the end piece and into aligned, threaded bores 58 in the respective bobbin sections. The diameter of each hole is substantially greater than the diameter of the shank portion of the associated screw so as to enable the end piece to be adjusted transversely relative to the bobbin before the screws are tightened to fix the position of the end piece relative to the bobbin. The bobbin sections and the end piece are formed of a suitable insulating material, such as plastic, which is sufficiently deformable so as to enable the bore portions thereof which grip the opposite ends of the core to distort very slightly to permit limited pivotal movement of the core relative to the bobbin and the end piece, this distortion being so small that it has an insignificant effect for most purposes. In the preferred form of the invention, this material comprises a phenolic resin which is impregnated with glass or linen fiber, for example. For clarity of illustration, FIG. 5 shows the core gripped by the bobbin and the end piece to a greater extent than is preferred.

With the oppostie ends of the core thus engaged by the end piece and the bobbin, the end piece can be moved transversely relative to the bobbin to pivot the core about the end thereof which is engaged by the bobbin, thereby to adjust the angular orientation of the magnetic axis of the sensor relative to the sensor housing without subjecting the core to any appreciable bending stresses which could adversely affect operation of the sensor. The cavity formed by recesses 42 of the bobbin sections has a slight taper, as illustrated, for enabling the core to be pivoted relative to the bobbin without the Permalloy strips touching the wall of the cavity, the cavity having its largest cross-sectional dimensions adjacent end piece 34 and its minimum cross-sectional dimensions adjacent recess portions 50 of the bobbin sections. The minimum cross-sectional dimensions of the cavity are sufficient to provide clearance for laps 46 of the core.

Longitudinal channels 60, which are smaller in cross-section than recesses 48, extend longitudinally between recesses 48 and the planar end surfaces 62 of the bobbin sections, these channels cooperating when the bobbin sections are assembled to provide a cylindrical opening for connecting the bore formed by recesses 48 to the outside of the housing. End piece 34 is provided with a cylindrical opening 64, smaller in diameter than cylindrical bore 52, extending axially between bore 52 and the planar end surface 66 of the end piece to connect bore 52 to the outside of the housing. As shown in FIG. 5, a stiff excitation wire 68 extends through these openings and through the hollow center of the tubular core. Groove sections 70 in the cylindrical surfaces of the bobbin sections cooperate to form a central circumferential groove on the bobbin in which a signal winding 72 is circumferentially wound, the signal winding, the end piece, and the screws cooperating to clamp the bobbin sections together around the core. The diameter of the bobbin at groove sections 70 is made small enough to provide excellent magnetic coupling between the signal winding 72 and the Permalloy strips on the core.

After assembly of sensor 22, the sensor is then inserted into groove 26 in tubular support 20 with the planar surfaces 40 of the bobbin sections perpendicular to the plane which includes edges 28 of the groove, as shown in FIG. 5, to provide additional clamping together of the bobbin sections, the dimensions of the groove and the bobbin being related so that the bobbin is snapped into the groove and held snugly therein by the frictional embrace of the groove. The bobbin sections are provided with flange portions 74 which cooperate to form a circumferential flange at the end of the bobbin to which the end piece is connected, this flange being engagable with the generally semi-annular end surface 75 of tubular support 20 for axially locating the bobbin in the tubular support.

After the magnetic sensor 22 has been inserted in the groove at one end of the tubular support, one leg of excitation conductor 68, which is bent to form a U-shaped or hairpin configuration, is inserted through sensor 22 and into the center of tubular support 20 until the bight 76 of the conductor engages end surface 66 of end piece 34. The other leg of the conductor extends along the outside of the tubular support. The excitation conductor is long enough so that both ends protrude well beyond the end of tubular support 20. The leg of the excitation conductor which extends through the tubular support is then inserted into the other sensor, such as 24, and this sensor is then moved to its proper position relative to the tubular support and is press-fitted into the corresponding groove in the same manner as sensor 22. The magnetic cores of both sensor units preferably have the same axial orientation in relation to their associated bobbin sections so that the laps 46 of the Permalloy strips on the core are aligned on the same side when the sensors are mounted in the grooves at the ends of the tubular support, which facilitates provision of a balanced or null condition in the magnetic locator apparatus. Lead wires 78 are then soldered to the signal windings 72, as indicated in FIG. 5, so as to provide a differential output, the wires passing along the exterior of the tubular support 20, as shown in FIG. 2. Electrical tape 80 may be employed where desired to hold the external leg of the excitation conductor 68 and the lead wires in position.

Before the assembly 18 is inserted into the tubular housing 10, bushings 82 of the type disclosed in the aforementioned copending applications are provided upon the assembly at spaced locations for supporting the assembly within the tubular housing. Each bushing is preferably formed by providing a strip of foam material 84, such as polyurethane, with a strip of adhesive tape 86 overlapping one end thereof and by wrapping the foam material around the exterior of tubular support 20 and securing it thereto by means of the tape. The foam brushing thus produced is large enough in diameter so as to be compressed and distorted when inserted into the housing 10. The bushings resist longitudinal movement of the assembly 18 within the housing, particularly in a direction opposite to the initial insertion direction.

The assembly 18 is then inserted into the housing until the adjustable end of sensor 22 projects slightly beyond the end of the housing for accessibility. At the opposite end of the housing a tubular cap 88 may be inserted, suitable apertures being provided therein for passage of the excitation and signal conductors, which are connected to suitable test electronics (not shown) of known construction so that sensor 22 can be adjusted to provide a null or balanced condition with respect to sensor 24. More particularly, the test electronics may include meters for showing the outputs of both sensors and/or a meter or oscilloscope for showing the gradient detected by the sensors, the housing 10 being supported on rollers for axial rotation about an axis perpendicular to the earth's magnetic field. After the housing 10 containing the assembly 18 is rotated on the rollers and the gradient noted, screws 38, if previously tightened, are backed off sufficiently to enable the transverse position of the end piece relative to the bobbin to be adjusted manually, as by finger touch, to achieve the desired alignment of the magnetic axes of the sensors. For some instruments, such as gradiometers, it is desirable to eliminate the misalignment of the sensors insofar as it is possible. In other instances, such as the magnetic locator illustrated, it is advantageous to adjust the sensor to provide a slight misalignment. After completion of the adjustment procedure, which is performed with all the sensor wiring intact, the screws 38 are then tightened to fix the position of the end piece relative to the bobbin. A suitable adhesive, such as an epoxy resin, may be applied to prevent subsequent shifting of the end piece relative to the bobbin.

Assembly 18 is then pushed into housing 10 to the position shown in FIG. 2 and the excitation and signal conductors are connected to the electronics within housing 12, these electronics being described fully in applicant's aforementioned copending applications. Assembly 18 is fixed in position in the housing by bushings 82 and by soldering the ends of the stiff excitation conductor 68 to a printed circuit board attached to a chassis fixed within housing 12, as indicated diagrammatically by reference character 90 in FIG. 2. The open end of the housing may be closed by a tubular cap 92 held in the housing by an interference fit.

Referring to FIGS. 6 and 7, in a magnetic sensor 22' in accordance with a second embodiment of the invention the sensor housing includes an end piece 100 which is transversely movable relative to the bobbin 102 by adjustment of brass flat-head screws 104, thereby to provide quick, positive and precise adjustment of the angular orientation of core 44, the screws also acting to fix the position of the end piece relative to the bobbin. More particularly, the elongated, cylindrical bobbin 102 comprises a narrow, thin-walled ceramic tube 106 having a low coefficient of thermal expansion and a pair of larger-diameter, cylindrical, insulating bobbin sections 108 and 110 which receive opposite ends of the ceramic tube and are secured thereto by a suitable adhesive, such as an epoxy resin. Axially aligned cylindrical bores 112 and 114 in the bobbin sections each have the same diameter as the inside diameter of the ceramic tube 106 and are cooperable with the ceramic tube to provide an axially disposed cavity for containing the tubular magnetic core 44. Axially adjacent bore 114 in bobbin section 110 is a cylindrical bore 116 of smaller diameter which is dimensioned to snugly receive one end of the magnetic core, the bobbin section having a frustoconical shoulder 118 intermediate bores 114 and 116 for facilitating insertion of the end of the core into bore 116. A smaller-diameter cylindrical opening 120 extends axially from bore 116 to end surface 122 of bobbin section 110.

End piece 110, which is preferably rectangular in transverse cross-section, is connected to the planar end surface 124 of bobbin section 108 by four of the flat-head screws 104, which have their threaded shank portions 126 received in threaded bores 128 in bobbin section 108. These bores are arranged such that the four screws are spaced about the perimeter of the rectangular end piece adjacent respective sides thereof with the frusto-conical surfaces 130 of the tapered head in engagement with inclined, marginal surface portions 132 of the end piece. (Alternatively, the end piece may be circular in transverse cross-section and three of the flat head screws may be employed to connect the end piece to the bobbin.) The end piece is provided with a central cylindrical bore 134 which extends from end surface 136 of the end piece through approximately ½ the thickness of the end piece, the bore being dimensioned to snugly receive the opposite end of the tubular magnetic core, and is further provided with a smaller-diameter cylindrical opening 138 which extends from bore 134 to end surface 139 of the end piece.

As in the first embodiment, the end piece and the bobbin sections are formed of a suitable deformable insulating material which enables the core-gripping portions thereof to distort slightly when the core is pivoted with respect thereto without subjecting the core to significant bending stresses.

Excitation conductor 68 extends through openings 120 and 138 and through the hollow center of the tubular magnetic core. The inner, annular end surfaces 140 and 142 of bobbin sections 108 and 110, respectively, cooperate with the central portion of the ceramic tube 106 to define a central circumferential groove in which a signal pick-up winding 144 is circumferentially wound. The thin wall of the ceramic tube, which forms the bottom surface of the circumferential recess, enables excellent magnetic coupling between the signal pick-up winding and the core, thereby providing high sensitivity. The cylindrical surface of each bobbin section is provided with a circumferential groove 146 which receives a corresponding O-ring 148 formed of a suitable deformable material, such as rubber.

To mount the assembled sensor, the sensor is inserted longitudinally into the end of tubular support 20' until end piece 100 and screws 104 project just beyond the circular end surface of the tubular support, the sensor being oriented so that the lead wires 150 from signal pick-up winding 144 are received in a longitudinal groove 152 on the inside surface of the tubular support. A second sensor, which may be the same as sensor 22' or may be of the type having a fixed magnetic axis, such as the sensors disclosed in the aforementioned copending applications, is then mounted at the other end (not shown) of tubular support 20', the excitation conductor 68 being inserted through both sensors and the signal windings, such as 144, being interconnected by lead wires 78 in the manner described above with respect to the first embodiment. The assembly including the sensors and support tube 20' is provided with bushings, such as bushings 82 of FIG. 2, and is inserted into housing 10 of FIG. 2, the excitation and signal conductors then being connected to suitable test electronics as in the first embodiment. Loosening one of the screws 104 and tightening the screw opposite it causes end piece 100 to be moved transversely relative to end surface 124 of bobbin section 108, thereby causing the core to be pivoted about the end received in bore 116 of bobbin section 110. Thus, in addition to connecting end piece 100 to the end of the bobbin, screws 104 provide quick, positive and precise adjustment of the angular orientation of the core in the housing. After sensor 22' has been adjusted to provide the desired alignment with the other sensor, the excitation and signal conductors are connected to the electronics within housing 12 and an end cap, such as 92 in FIG. 2 is inserted in the open end of housing 10.

While preferred embodiments of the invention have been shown and described, it will be apparent to those skilled in the art that changes can be made in these embodiments without departing from the principles and spirit of the invention, the scope of which is defined in the appended claims.

The invention claimed is:

1. Magnetic sensor apparatus comprising a housing for an elongated magnetic core, the housing including an elongated bobbin having a longitudinal cavity therein for receiving the core and having means for pivotally engaging one end of the core, and an end piece for connection to the bobbin, the end piece having means for engaging the other end of the core and the position of the end piece being adjustable transversely relative to the bobbin.

2. Magnetic sensor apparatus as set forth in claim 1, further comprising means for fixing the position of the end piece relative to the bobbin.

3. Magnetic sensor apparatus as set forth in claim 2, wherein the end piece has a hole therethrough, wherein the bobbin has a threaded bore therein, and wherein the fixing means comprises a headed screw having a threaded shank portion for insertion through said hole to be theaded into said bore, the cross-sectional dimensions of the hole being substantially greater than the diameter of said shank portion so as to permit adjustment of the end piece transversely relative to the bobbin before the screw is tightened.

4. Magnetic sensor apparatus as set forth in claim 3, wherein the end piece has a plurality of said holes, wherein the bobbin has a respective plurality of said threaded bores, and wherein said fixing means comprises a respective plurality of said screws for insertion through said holes to be threaded into said bores.

5. Magnetic sensor apparatus as set forth in claim 1, wherein the bobbin has a plurality of threaded bores positioned to be spaced around the perimeter of the end piece, and wherein the fixing means comprises screws for threading into the bores, said screws having tapered heads for contacting marginal portions of the end piece so that adjustment of the screws causes the end piece to move transversely relative to the bobbin.

6. Magnetic sensor apparatus as set forth in claim 5, wherein said end piece is rectangular in transverse cross-section, wherein said bobbin has four of said threaded bores positioned to be adjacent respective sides of the end piece, and wherein the fixing means comprises four of said screws for threading into said bores.

7. Magnetic sensor apparatus as set forth in claim 6, wherein the marginal portions of the end piece comprise inclined surfaces of the end piece.

8. Magnetic sensor apparatus as set forth in claim 1, wherein the core is tubular in shape, and wherein the end piece and the bobbin are provided with longitudinal cylindrical bores dimensioned to snugly receive the opposite ends of the tubular core, the end piece and the bobbin being formed of material which is sufficiently deformable in the region of said bores so as to permit limited pivotal movement of the core relative to the end piece and the bobbin.

9. Magnetic sensor apparatus as set forth in claim 8, wherein the bobbin is provided with a generally frusto-conical shoulder adjacent its associated cylindrical bore for facilitating insertion of the end of the core into said associated bore.

10. Magnetic sensor apparatus as set forth in claim 1, wherein said cavity is tapered, said cavity having its largest cross-sectional dimensions adjacent said end piece.

11. Magnetic sensor apparatus as set forth in claim 1, wherein the bobbin comprises two identical, molded half sections adapted to be clamped together.

12. Magnetic sensor apparatus as set forth in claim 1, wherein the bobbin is provided with a circumferential flange at one end thereof for axially locating the bobbin in a tubular support.

13. Magnetic sensor apparatus as set forth in claim 1, wherein the bobbin has a central circumferential groove thereon for receiving a signal winding.

14. Magnetic sensor apparatus as set forth in claim 13, wherein the portion of the bobbin having the circumferential groove comprises a thin-walled ceramic tube.

15. A magnetic sensor comprising a housing containing an elongated magnetic core, the housing including an elongated bobbin having a longitudinal cavity therein receiving the core and having means pivotally engaging one end of said core, an end piece connected to the bobbin, the end piece having means engaging the other end of said core, the position of the end piece being adjustable transversely relative to the bobbin, and means for fixing the position of the end piece relative to the bobbin.

16. A magnetic sensor as set forth in claim 15, wherein the end piece has a plurality of holes therethrough, wherein the bobbin has a respective plurality of threaded bores therein in alignment with the holes, and wherein the fixing means comprises a respective plurality of headed screws having threaded shank portions inserted through the holes and threaded into said bores, the cross-sectional dimensions of each hole being substantially greater than the cross-sectional dimensions of the shank portion of the associated screw so as to permit adjustment of the end piece transversely relative to the bobbin before the screws are tightened.

17. A magnetic sensor as set forth in claim 15, wherein the bobbin has a plurality of threaded bores spaced around the perimeter of the end piece, and wherein the fixing means comprises headed screws threaded into the bores, the heads of said screws having conical surfaces contacting marginal portions of the end piece so that adjustment of the screws causes the end piece to move transversely relative to the bobbin.

18. A magnetic sensor as set forth in claim 15, wherein the bobbin has a central circumferential groove thereon, and wherein the sensor further comprises a signal winding wound circumferentially in said groove.

19. Magnetic detecting apparatus comprising a tubular support, two magnetic sensors mounted at opposite ends of said support, and an excitation conductor passing through the sensors and through the tubular support, at least one of the sensors comprising an elongated bobbin, an elongated magnetic core received in the bobbin and having one end pivotally engaged by the bobbin, an end piece connected to the bobbin, the end piece having means engaging the other end of the core and the position of the end piece being adjustable transversely relative to the bobbin, means for fixing the position of the end piece relative to the bobbin, and a signal winding circumferentially wound about the bobbin in a circumferential groove on the bobbin.

20. Magnetic detecting apparatus as set forth in claim 19, wherein the core is tubular in shape, and wherein said bobbin and said end piece have longitudinal cylindrical bores snugly receiving opposite ends of the core, the end piece and the bobbin being formed of material which is sufficiently deformable in the region of said bores so as to permit limited pivotal movement of the core relative to the end piece and the bobbin.

* * * * *